United States Patent
Testin

(10) Patent No.: US 6,700,763 B2
(45) Date of Patent: Mar. 2, 2004

(54) PROTECTED DUAL-VOLTAGE MICROCIRCUIT POWER ARRANGEMENT

(75) Inventor: William John Testin, Indianapolis, IN (US)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 10/351,129

(22) Filed: Jan. 24, 2003

(65) Prior Publication Data

US 2003/0231441 A1 Dec. 18, 2003

Related U.S. Application Data

(60) Provisional application No. 60/388,800, filed on Jun. 14, 2002.

(51) Int. Cl.[7] ................................................. H02H 9/00
(52) U.S. Cl. ............................. 361/56; 361/18; 361/58; 361/118
(58) Field of Search ............................. 361/18, 56, 58, 361/111, 118, 119

(56) References Cited

U.S. PATENT DOCUMENTS

| | | | |
|---|---|---|---|
| 5,266,849 A | * 11/1993 | Kitahara et al. | 326/62 |
| 5,708,550 A | 1/1998 | Avery | 361/56 |
| 5,774,318 A | 6/1998 | McClure et al. | 361/56 |
| 5,933,025 A | * 8/1999 | Nance et al. | 326/81 |
| 6,040,968 A | 3/2000 | Duvvury et al. | 361/56 |
| 6,043,539 A | 3/2000 | Sugasawara | 257/357 |
| 6,060,752 A | 5/2000 | Williams | 257/355 |
| 6,154,845 A | 11/2000 | Ilkbahar et al. | 713/300 |
| 6,189,107 B1 | 2/2001 | Kim et al. | 713/300 |
| 6,218,889 B1 | 4/2001 | Fujiki et al. | 327/427 |
| 6,269,011 B1 | 7/2001 | Ohshima | 363/50 |
| 6,313,615 B1 | 11/2001 | Fayneh et al. | 323/281 |
| 6,335,637 B1 | 1/2002 | Correale et al. | 326/80 |

* cited by examiner

Primary Examiner—Stephen W. Jackson
(74) Attorney, Agent, or Firm—Joseph S. Tripoli; Sammy S. Henig; Harvey D. Fried

(57) ABSTRACT

A microcircuit includes core and other portions, which receive different supply voltages from disparate sources. An electrostatic discharge protection (ESD) circuit internally connects the lower and higher voltage terminals together with a diode, poled so that the diode conducts if the nominally lower voltage supply exceeds the higher voltage supply. If the high voltage supply fails or even drops below the value of the low voltage supply, the diode conducts, and current is drawn in an amount which may overheat the microcircuit. A shut-down circuit is provided for sensing the voltage of the higher-voltage source, and shutting down the lower-voltage source any time the higher-voltage source drops below either the actual voltage or nominal voltage of the lower value source.

16 Claims, 5 Drawing Sheets

PROTECTED DUAL-VOLTAGE MICROCIRCUIT POWER ARRANGEMENT

CROSS REFERENCE TO RELATED APPLICATIONS

This is a non-provisional application which claims the benefit of provisional application serial No. 60/388,800, filed Jun. 14, 2002.

FIELD OF THE INVENTION

This invention relates generally to integrated circuits and more particularly to microcircuits requiring two or more different energizing voltages.

BACKGROUND OF THE INVENTION

A continuing need for higher processing speed has accompanied the advent of high-speed digital processing equipment. The higher processing speed, in turn, has tended to increase the heat dissipated internally in microcircuits which implement the processing. This heat, in turn, tends to raise the temperatures of the microcircuits. The reliability of solid-state microcircuits depends to a substantial degree on the temperature at which they operate. Even short periods of operation at temperatures elevated above the maximum temperature rating of a given microcircuit can substantially reduce its reliability. For this reason, a great deal of attention is directed toward heat removal from microcircuits, to the extent that liquid coolants have been proposed for flow adjacent to solid-state chips, as described in U.S. Pat. No. 6,388,317, issued May 14, 2002 in the name of Reese.

One of the techniques which has been applied for reducing the temperature of high-density microcircuits is to use lower power-supply or energizing voltages for those "core" portions of the microcircuit which are most densely packed or which operate at the highest switching speed, relative to the energizing voltage applied to "peripheral" circuits on the microcircuit. This gives rise to "dual-voltage" microcircuits, which require two or more different energizing voltages. Dual-voltage microcircuits, as one might expect, require separate power supplies to provide the direct voltages which are required for the core and peripheral portions of the microcircuit. A common type of dual-voltage microcircuit requires both 2.5-volt and 3.3-volt sources.

The provision of many functions on a microcircuit requires that the spacing between conductors in the microcircuit be very small, and also that the solid-state elements to which the conductors connect be very small. This small size contributes to the usefulness of the microcircuit, and also allows fast operation. The close spacings and small size, however, are disadvantageous in that the spacings are so small that damaging voltage breakdown or flashover may occur with relatively low voltages. For this reason, electromagnetic surge and/or over-voltage protection is often provided by non-linear devices in the form of diodes, diode-connected field-effect transistors (FETs), or other unidirectional current conducting devices, as described, for example, in U.S. Pat. No. 5,708,550 issued Jan. 13, 1998 in the name of Avery; U.S. Pat. No. 6,040,968, issued Mar. 21, 2000 in the name of Duvvury et al.; U.S. Pat. No. 6,043,539, issued Mar. 28, 2000 in the name of Sugasawara; and U.S. Pat. No. 6,060,752, issued May 9, 2000 in the name of Williams. These nonlinear devices are often connected to the various electrodes of the microcircuit which provide connection to the outside world, so as to damp surges and bypass over-voltages around those portions of the microcircuit which are to be protected. One known scheme is to connect unidirectional current conducting device(s) in an antiparallel manner between a first voltage input electrode of a microcircuit and a second voltage input electrode, as described in the Duvvury et al. patent, where the supply voltages have different values. The Duvvury et al. arrangement has the effect of "connecting" the voltages of the electrodes together whenever the voltage of one source attempts to deviate from the other by more than the offset voltage of the unidirectional current conducting devices.

Improved dual-supply arrangements are desired.

SUMMARY OF THE INVENTION

A power supply protection apparatus according to an aspect of the invention comprises a first power supply for generating a first supply output level to energize a first load circuit, and a second power supply for generating a second supply output level to energize a second load circuit. A clamp circuit is responsive to a signal that is indicative of the second supply output level for clamping the first supply output level, when both a difference between the first and second supply output levels is outside a first normal operation range of values and the second supply output level is within a second normal operation range of values. The clamping of the first supply output level is prevented, when the difference is within the first normal operation range of values. A detector is responsive to the second supply output level indicative signal and is coupled to the first power supply for varying the first supply output level to prevent the clamping of the first supply output level, when the second supply output level is outside the second normal operation range of values.

In one version of the apparatus, the clamp circuit includes a switch.

In another version of the apparatus, the clamp circuit includes one of a rectifier and a diode.

In one avatar of the apparatus, the first load circuit forms a first stage and the second load circuit forms a second stage of a common integrated circuit.

In another avatar of the apparatus, the first power supply level is disabled, when the second supply output is outside the second normal operation range of values.

DESCRIPTION OF THE INVENTION

Figure 1:
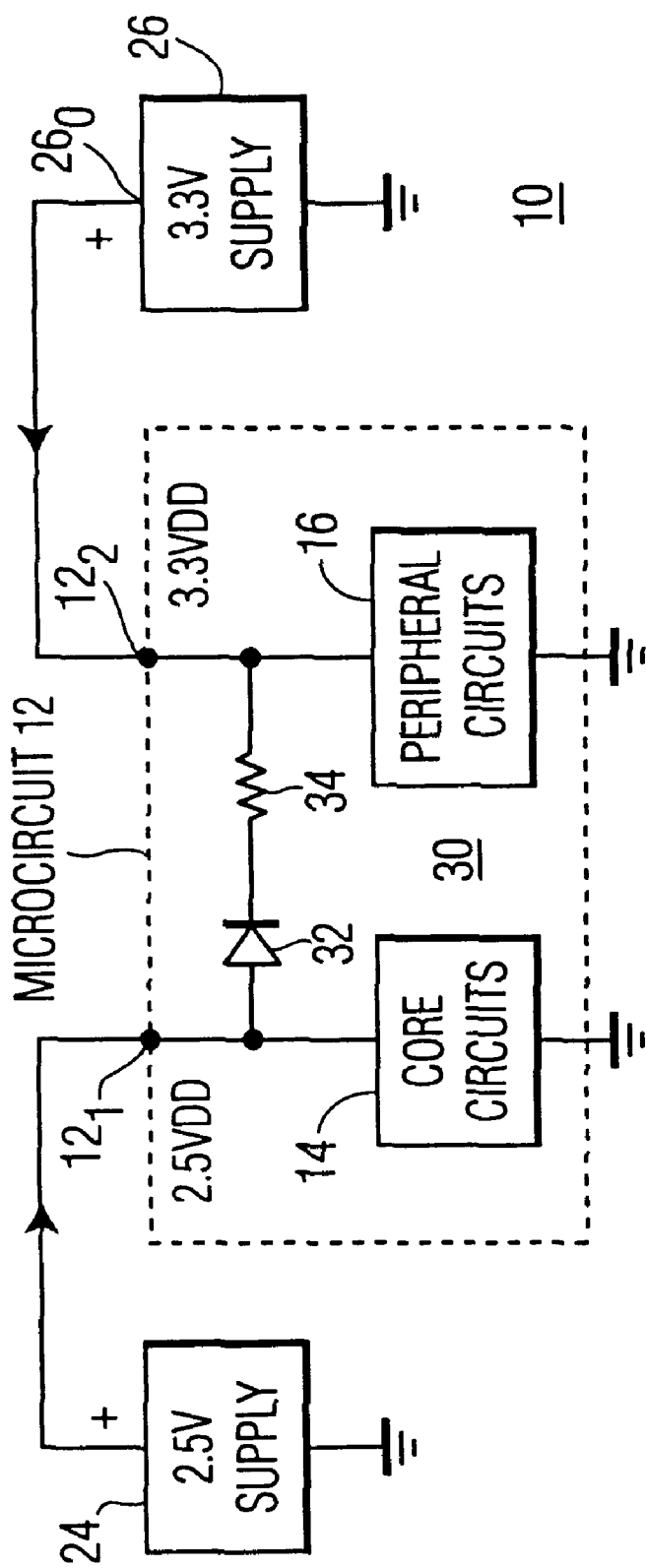
FIG. 1 is a simplified illustration of an arrangement including a microcircuit including core and peripheral processing portions, and also including first and second power supplies for providing energizing voltage for the core and peripheral portions, respectively.

FIG. 1 is a simplified illustration of an arrangement 10 including a microcircuit 12 including core and peripheral processing portions 14 and 16, respectively. A first power supply 24, extrinsic to the microcircuit 12, produces energizing voltage at a first voltage, such as 2.5 volts, for application to a first voltage input port or electrode $12_1$. A second extrinsic power supply 26 produces energizing voltage for application to a second energizing voltage input port or electrode $12_2$. As illustrated in FIG. 1, the core circuits 14 of microcircuit 12 are energized by the voltage applied from power supply 24, and the peripheral circuits 16 are energized by the voltage applied from power supply 26. In FIG. 1, the first supply voltage produced by power supply 24 is 2.5 volts, and the second supply voltage, produced by power supply 26, is 3.3 volts, both poled as indicated by the plus (+) symbols. Thus, core circuit portion 14 of microcircuit 12 operates on (or at) a nominal voltage of 2.5 volts, and the peripheral circuits 16 operate at a nominal voltage of 3.3 volts. Those skilled in the art will recognize that the application of a voltage requires two conductors to form a complete circuit for the flow of charge, and that the "ground" connections illustrated by conventional ground symbols, or their equivalent, must be provided.

The actual voltage at a point in a circuit, relative to another point, may be different from the nominal value, either instantaneously as a result of a surge, or continuously as a result of a mis-set control or damage to one or more components. In the arrangement of FIG. 1, a protective circuit 30 is provided as a unidirectional current conducting device 32 in the form of a diode or rectifier, having its anode connected to first input voltage electrode $12_1$, and having its cathode connected, possibly by way of a resistor 34, and second input voltage electrode $12_2$ to second power supply 26. In the event that the voltage produced by first power supply 24 should attempt to rise to a level nominally greater than the voltage produced by second power supply 26, or in the event of a voltage surge from any source exceeding that nominal level, the unidirectional current conducting device 32 becomes conductive, and provides a path for the flow of current from power supply 24 to power supply 26, by way of electrode $12_1$, unidirectional current conducting device 32, resistor 34, and electrode $12_2$. The flow of current is intended to "clamp" the output voltage of power supply 24 to a value not substantially greater than the output voltage of power supply 26. Resistor 34 of protective circuit 30, if used, has a value selected to limit the current through the protective circuit 30 to a nondestructive value during such fault conditions, and also to provide a resistive load which tends to damp momentary surges, but should have a value sufficiently low so that the current flowing in the protective circuit 30, together with current flowing in core circuit portions 14, is sufficient to reduce the output voltage of power supply 24. The reduction of output voltage of power supply 24 may be accomplished by means of an overcurrent fold-back circuit associated with power supply 24, or it may be accomplished simply by loading the inherent internal impedance of power supply 24 sufficiently to reduce its actual output voltage to the desired level.

In the above description of the operation of the protective circuit 30 of FIG. 1, including unidirectional current conducting device 32, the effects of the offset voltage of the unidirectional current conducting device, if any, have not been considered. Those skilled in the art know that various forms of unidirectional current conducting devices have offset voltages, which are forward voltages which must be exceeded before significant conduction occurs. These offset voltages also exist during conduction, so that, in actuality, the voltage of the nominally 2.5 volt supply would have to rise to the sum of 3.3 volts plus the forward offset voltage of device 32 before conduction in circuit 30 would begin.

In operation of the arrangement 10 of FIG. 1, microcircuit power supply 26 may be shorted to ground, or generate a voltage which is less than its nominal voltage. In such a situation, the nominal voltage produced by power supply 24, illustrated as being 2.5 volts, may exceed (by one or more offset voltages, if present) the actual voltage produced by nominally 3.3 volt power supply 26. For example, if power supply 26 should have its output port shorted to ground internally, zero volts would be applied from power supply 26 to second energizing voltage input port 122. The protective circuit 30 would find this condition to be indistinguishable from an over-voltage condition of first power supply 24, and the unidirectional current conducting device 32 would become conductive. With unidirectional current conducting device 32 conducting, current would flow from operational power supply 24 to power supply 26 by way of electrode $12_1$, unidirectional current conducting device 32, resistor 34, and electrode 122. The flow of current through protective circuit 30 is added to the existing current then being sourced by supply 24.

In a particular video processor for which internal construction details are not available, external "black box" measurements have determined that it appears to have a diode-resistor combination corresponding to elements 32 and 34 of FIG. 1 connected between the power sources 24 and 26, as indicated in FIG. 1. It has been discovered that the temperature of the integrated circuit, corresponding to integrated circuit 12 of FIG. 1, tends to rise when protective circuit 30 of FIG. 1 operates. More particularly, the case temperature of the integrated circuit reached 100E C., which exceeds the 80E C. absolute maximum temperature specified for this integrated circuit. It is believed that the power dissipated in unidirectional current conducting device 32 and resistor 34, possibly in conjunction with power dissipation in other devices, adds to the heat generated by the integrated circuit during normal operation, and results in the overtemperature condition.

Figure 2A:
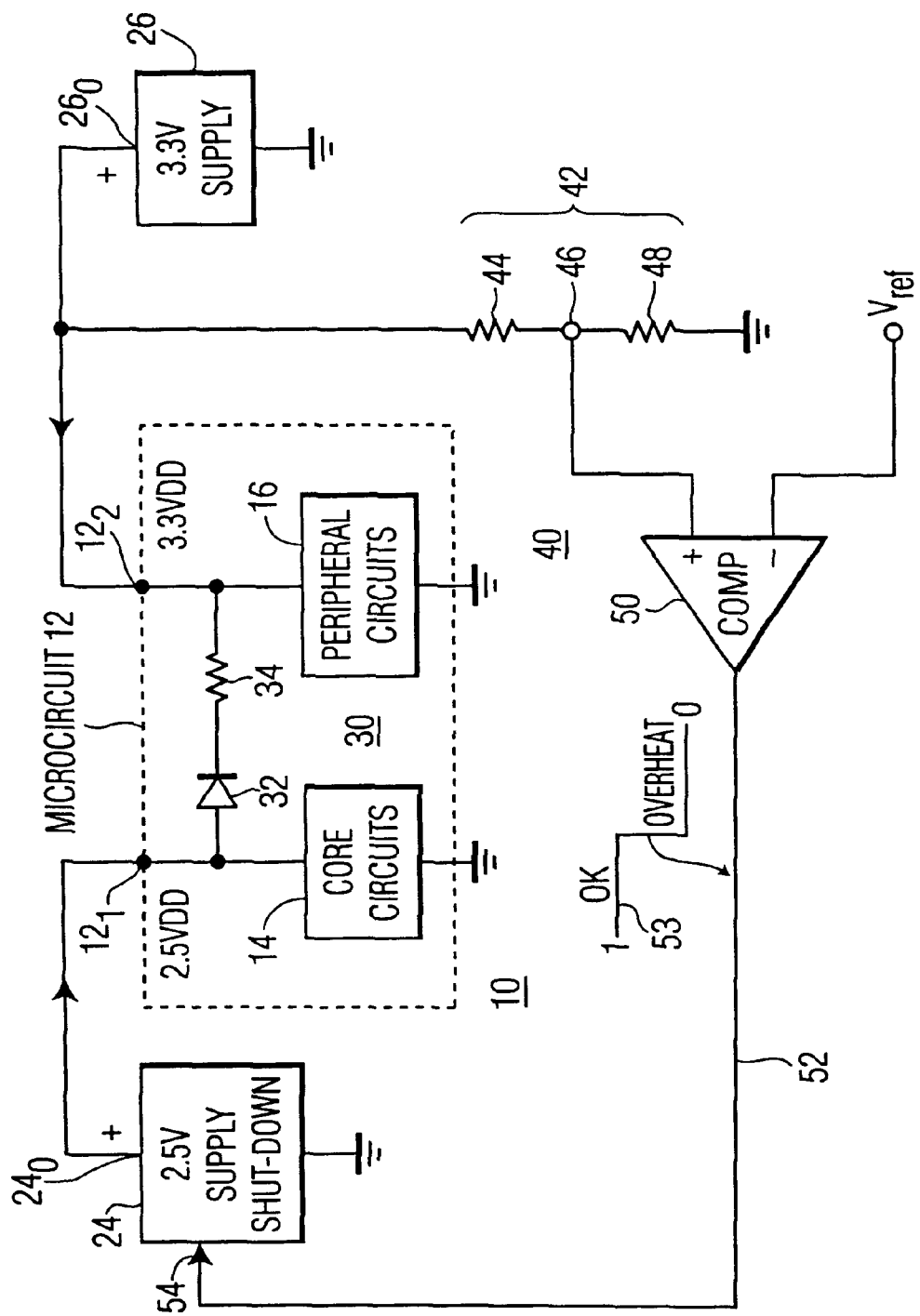
FIG. 2a is a simplified illustration of an arrangement similar to that of FIG. 2, including portions which are added in accordance with an aspect of the invention.

FIG. 2a is a simplified diagram similar to FIG. 1, illustrating an arrangement according to an aspect of the invention for tending to prevent overtemperature of the integrated circuit due to operation of protective circuit 30. In FIG. 2a, elements corresponding to those of FIG. 1 are designated by like reference numerals. A comparator circuit designated generally as 40 includes a voltage divider 42 illustrated as including first and second serially-connected resistors 44 and 48 connected between the output terminal 26o of power supply 26 and ground, and having a tap 46 therebetween. Those skilled in the art know that the voltage at the tap 46 is a known portion of the actual voltage at output terminal 26o. The exact percentage will depend upon the relative values of resistors 44 and 48, among other factors. Thus, the actual voltage at tap 46 of voltage divider 42 will be a fixed percentage of the actual voltage at output terminal 26o. According to an aspect of the invention, comparator arrangement 40 includes a high-gain amplifier (also known simply as a "comparator" or "comp") 50, which has a first input terminal connected to tap 46 of voltage divider 42, and a second input terminal connected to a reference voltage designated as Vref. The output terminal of comparator device 50 is connected by way of a signal path 52 to a "shut-down" input port 54 of first power supply 24. The 2.5 volts power supply 24 reduces its output voltage, or shuts down or ceases operation, when the voltage applied to pin 54 is logic low or 0. The value of reference voltage Vref is selected to equal the voltage occurring at tap 46 when the actual voltage at the output 26o of second power supply 26 is equal to the nominal output voltage (minus one or more offset voltages). Put another way, using the example of a first voltage source nominal voltage of 2.5 volts, the reference voltage source Vref is selected to have the same value as occurs at the tap 46 when the actual voltage at output terminal 26o of second power supply 26 equals 2.5 volts or less (plus offsets, if applicable). More specifically, if the actual voltage at tap 46 is 0.28 times the actual voltage at the output port 26o, and the actual voltage of power supply 26 is 2.5 volts, then the tap voltage will be 0.7 volts (assuming no offset). The reference voltage source Vref of FIG. 2a is then selected to be 0.7 volts or less.

In operation of the arrangement of FIG. 2a, comparator arrangement 40 will produce a first signal state on signal path 52 when the actual value of the 3.3 volt supply 26 exceeds 2.5 volts, and a different or other state when the actual value of the 3.3 volt supply 26 is less than 2.5 volts, assuming no offsets. Thus, the output of comparator arrangement 40 gives an indication of those intervals during which current may flow through protective circuit 30 of FIG. 2a, and during which overheating of microcircuit 12 may occur. In FIG. 2a, signal 53 associated with signal path 52 is represented as having a logic high level associated with a normal or "OK" condition, which occurs when the voltage at tap 46 of voltage divider 42 is 0.7 volts or more, corresponding to an output voltage of nominal 3.3 volt supply 26 of 2.5 volts or more. Correspondingly, the logic low level of signal 53 produced by comparator 40 represents a potential overheating condition, which might occur when the voltage at tap 46 of voltage divider 42 is less than 0.7 volts, corresponding to an output voltage of nominal 3.3 volt supply 26 of less than 2.5 volts.

According to a further aspect of the invention, the signal on conductor 52 of FIG. 2a is applied to a shut-down input port 54 of first power supply 24, to shut down the first voltage source when the conditions which might cause overheating occur. More specifically, with the inverting (−) input of comparator device 50 connected to reference voltage source Vref and the noninverting (+) input port of comparator device 50 connected to tap point 46 of voltage divider 42, comparator 40 will produce a logic low or logic 0 level on signal conductor 52 when the voltage at tap 46 is below Vref, which is when the conditions which may lead to overheating of microcircuit 12 occur. Comparator 40 produces a logic high signal under normal conditions, which is to say when the actual value of the 3.3 volt supply at terminal 26o exceeds 2.5 volts. If the control signal required at input port 54 for shutting down 2.5 volt power supply 24 happened to be a logic high level rather than a logic low level, an inverter could be connected to the output of comparator device 50 to invert the signal, if necessary to properly control first power supply 24, or alternatively the connections to the inverting and noninverting input ports of comparator 40 could be reversed.

Figure 2B:
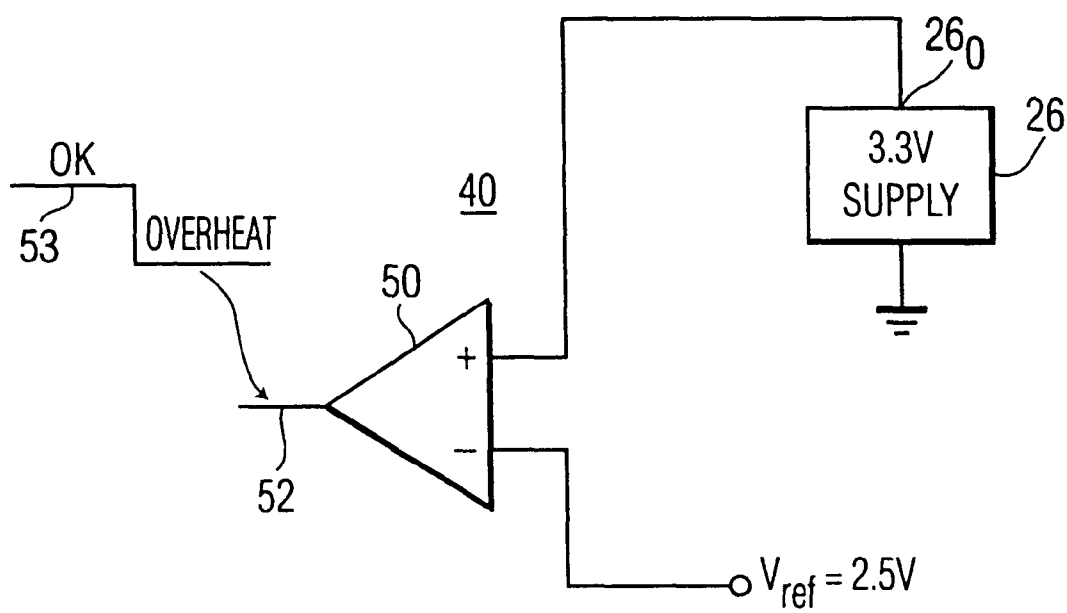
FIG. 2b illustrates a portion of the arrangement of FIG. 2a modified in accordance with another aspect of the invention.

FIG. 2b illustrates an alternative arrangement of the comparator 50 with reference voltage Vref and power supply 26, in which the voltage divider is done away with, and the reference voltage is set to equal the nominal voltage of power supply 24, namely 2.5 volts. This arrangement provides direct comparison between the actual output voltage at output port 26o of power supply 26 and the nominal value of power supply 24.

Figure 3:
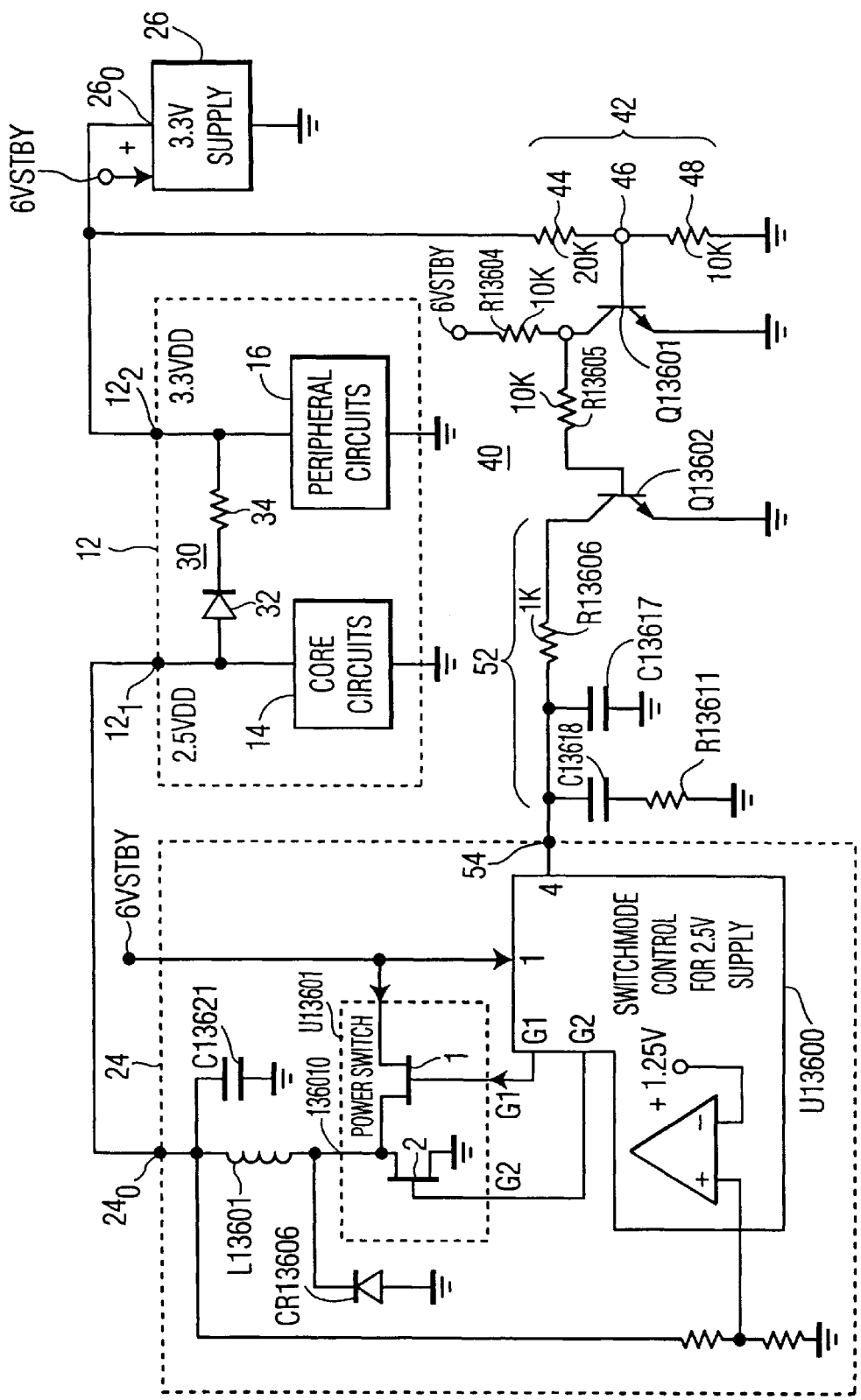
FIG. 3 is similar to FIG. 2a, but illustrates more detail of one particular embodiment according to an aspect of the invention.

FIG. 3 is a somewhat more detailed representation of a particular embodiment of the comparator and power supply aspect of the invention. In FIG. 3, portions U13600 and U13601 of 2.5 volts power supply 24, and power supply 26, are all powered from a 6V_STBY direct power source.

Integrated circuit U13600 of FIG. 3 is a type LTC1530 high power synchronous switching regulator controller manufactured by Linear Technology Corporation, of 1630 McCarthy Blvd, Milpitas, Calif. 95035-7417. It is intended to drive two external FET devices from its G1 and G2 terminals. The two external FET devices are located in U13601. The LTC530 contains a precision trimmed reference and internal feedback system intended to provide worst-case output voltage regulation of 2% over temperature, load current and line voltage shifts. The compensation pin 4 of the LTC530 is internally connected to the error amplifier and to the input of the PWM comparator, and is intended to be connected to an external RC network to compensate the feedback loop for optimum transient response. Shut-down of the 530 is accomplished by pulling compensation pin 4 below 0.1 volts with an open-collector or open-drain transistor.

In FIG. 3, comparator 40 includes an NPN bipolar transistor Q13601 having its base connected to tap 46 of voltage divider 42, and having its emitter connected to ground. The collector of transistor Q13601 is connected by way of a resistor R13604 to the 6V_STBY source, and by way of a further resistor R13605 to the base of an inverter-connected bipolar transistor Q13602. The collector of transistor Q13602 is connected by way of a resistor R13606 to the loop compensation input port 4 of a switchmode control integrated circuit U13600 which drives the 2.5 volts power supply 24. Capacitors C13617 and C136118, in conjunction with resistor R13611, all of which are connected to pin 4 of U13600, provide loop compensation for the switch mode power supply 24.

In FIG. 3, the switching signal output ports G1 and G2 of integrated circuit U13600 drive corresponding input ports of power switch integrated circuit U13601. Also illustrated in FIG. 3 are the switched output port 13601o, a series inductor L13601 and a "free-wheeling" diode or rectifier CR13606, both connected to the output port 13601o, and a filter capacitor C13621 connected between the output side of inductor L13601 and ground. The output voltage of the 2.5 volts source 24 is generated at output port 24o, which is connected to capacitor C13621 and inductor L13601.

In operation of the arrangement of FIG. 3, the 3.3 volt power supply 26 normally produces about 3.3 volts at its output port 26o. With 3.3 volts at output port 26o, and with resistors 44 and 48 having resistances of 20 k and 10 K ohms, respectively, the voltage at tap 46 of voltage divider 42 tends toward 1.1 volts, but limits at about 0.7 volts in response to current drawn by the base of transistor Q13601 in its saturated state. With transistor Q13601 saturated, its collector is near ground voltage, and is insufficient to render Q13602 conductive. With transistor Q13602 nonconductive, its collector is essentially an open circuit, and integrated circuit U13600 operates normally to produce switch mode signals G1 and G2, with the loop compensation elements C13617, C136118, and R13611 providing loop compensation. Switching integrated circuit U13601 receives the switching signals G1 and G2, and switches to produce current through inductor L13601 in the usual switch-mode manner, to produce the desired 2.5 volts at output port 24o of 2.5 volts supply 24.

The arrangement according to this aspect of the invention has the salient advantage of presenting both low leakage and low capacitance to the loop compensation input port 4 of switchmode driver U13600. The open collector of transistor Q13602 presents a resistive impedance greater than 1 megohm, and also presents a capacitive loading of less than about 2.5 picofarads, which is insignificant by comparison with the loop compensation capacitors.

Upon the occurrence of a momentary fault or surge which causes an increase in voltage at input port $12_1$ of microcircuit 12 of FIG. 3 to a value greater than 3.3 volts plus the single offset voltage of diode 32, unidirectional current conducting device 32 conducts to couple the surge to resistor 34, which tends to absorb the surge.

If the voltage of 3.3 volt power supply 26 of FIG. 3 decreases to a value nominally below 2.5 volts (actually below 2.5–0.7=1.8 volts), the voltage at tap 46 of voltage divider 42 decreases to less than 0.7 volts, which is the forward voltage drop of an ordinary silicon transistor. Transistor Q13601 becomes nonconductive, and its collector voltage tends to rise toward the 6V_STBY voltage. This rise in the collector voltage of transistor Q13601 is communicated to the base of transistor Q13602, which turns ON, thereby bringing its collector voltage essentially to ground. In effect, this connects resistor R13606 between loop compensation pin 4 of integrated circuit U13600, which loads an internal current source in the integrated circuit, which causes the voltage at pin 4 to drop below about 0.1 volts. This decrease in voltage at pin 4, in turn, causes the switchmode driver U13600 to cease operation, or more specifically to cease production of switch mode signals G1 and G2. In the absence of switch mode signals G1 and G2, power switch integrated circuit U13601 ceases operation, and produces no further voltage for application to nominal 2.5 volts output port 24o. Consequently, the voltage at the nominal 2.5 volts output terminal 24o drops to zero volts, which is a voltage at which protection circuit 30 cannot conduct to the nominal 3.3 volt supply 26, regardless of how low a voltage the nominal 3.3 volt supply actually drops to. Thus, current cannot flow through the ESD protection circuit 30 for an extended period of time due to a decrease in the actual value of the nominal 3.3 volt supply, because the 2.5 volts supply is disabled whenever the nominal 3.3 volt supply decreases to a value below about 2.5 volts. The shut-down of the 2.5-volt supply 24 occurs within about 10 to 20 microseconds from the time the nominal 3.3 volt power supply voltage decreased below 2.5 volts, which is sufficiently fast to prevent damage to the integrated circuit 12.

Figure 4:
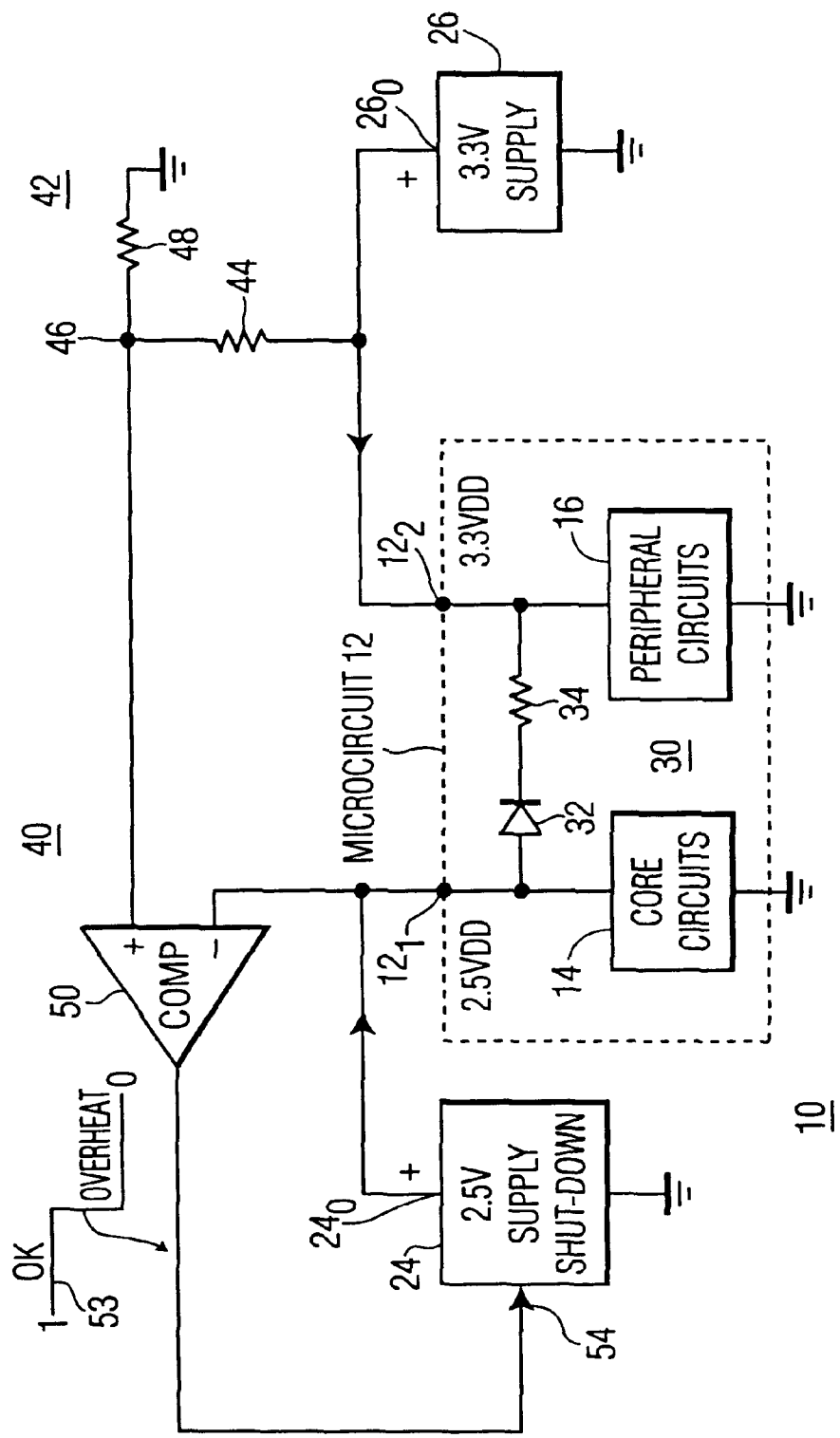
FIG. 4 is similar to FIG. 2a, but shows an alternative source of reference voltage.

An alternative reference voltage is illustrated in FIG. 4, which is otherwise similar to FIG. 2a. In FIG. 4, the voltage divider 42 divides the nominal value of the 3.3 volt supply 26 down to 2.5 volts, the nominal output voltage of supply 24. In FIG. 4, the inverting (−) input port of comparator 50 is connected to the output port 24o of the first or low-voltage power supply 24. This eliminates the need for a reference voltage having a voltage equal to the nominal voltage of supply 24, and has the result that shut-down occurs when the actual value of the 3.3 volt supply drops below the actual value of the 2.5 volts supply (ignoring the forward offset voltage of device 32).

The arrangement according to an aspect of the invention forces power supply turn-on during start-up in a sequence which avoids unwanted turn-on of protective circuit 30. More particularly, the 2.5 volts power supply cannot start until the nominally 3.3 volt power supply has an output voltage exceeding 2.5 volts.

It should be noted that the actual voltage at which sensing circuit 40 of FIGS. 2a, 2b, 3, or 4 operate may deviate from the nominal calculated values because the heating which results from current flowing through the protective circuit 30 may be tolerable at some current levels, especially if the integrated circuit is operated with an effective heat sink or in a cool location. Thus, exactitude should not be expected in the settings at which reduction of the voltage of the lower-voltage supply is triggered.

Other embodiments of the invention will be apparent to those skilled in the art. For example, while specific values of the low-voltage (24) power supply and high-voltage (26) power supply have been used for description, the invention is applicable to any situation in which two or more supplies of different voltages are required in the powered or integrated circuit.

What is claimed is:

1. A power supply protection apparatus, comprising:
   a first power supply for generating a first supply output level to energize a first load circuit;
   a second power supply for generating a second supply output level to energize a second load circuit;
   a clamp circuit responsive to a signal that is indicative of said second supply output level for clamping said first supply output level, when both a difference between said first and second supply output levels is outside a first normal operation range of values and said second supply output level is within a second normal operation range of values, the clamping of said first supply output level being prevented, when said difference is within said first normal operation range of values; and
   a detector responsive to said second supply output level indicative signal and coupled to said first power supply for varying said first supply output level to prevent the clamping of said first supply output level, when said second supply output level is outside said second normal operation range of values.

2. A power supply protection apparatus according to claim 1, wherein said clamp circuit comprises a switch.

3. A power supply protection apparatus according to claim 1, wherein said clamp circuit comprises a rectifier.

4. A power supply protection apparatus according to claim 1, wherein said clamp circuit comprises a diode.

5. A power supply protection apparatus according to claim 1, wherein said first load circuit forms a first stage and said second load circuit forms a second stage of a common integrated circuit.

6. A power supply protection apparatus according to claim 1, wherein said first power supply level is disabled, when said second supply output is outside said second normal operation range of values.

7. A protection circuit, comprising:
   a first power supply for generating a first supply voltage coupled to a first load circuit to energize said first load circuit;
   a second power supply for generating a second supply voltage coupled to a second load circuit to energize said second load circuit;
   a limiter coupled to said first power supply and responsive to said second power supply voltage for tending to limit a magnitude of said first supply voltage via a first protection control path, when a difference between said first supply voltage and said second supply voltage is outside a normal operation, first range of values; and
   a comparator having an input coupled to said second power supply for producing a control signal that is coupled to said first power supply for reducing said magnitude of said first supply voltage via a second protection control path, when said second supply voltage is outside a normal operation, second range of values.

8. A circuit arrangement, comprising:
   an integrated circuit including a first power input port for accepting a first voltage for energizing core portions of said integrated circuit, and also including a second power input port for accepting, from a second voltage source, a second voltage having a nominal value greater than said first voltage, for powering portions of said integrated circuit other than said core portions, said integrated circuit further including a unidirectional current conducting device coupled to said first and second power input ports, for conducting when the actual voltage at said first input port exceeds the actual voltage at said second input port;

a first voltage source for providing said first voltage at a nominal value, said first voltage source including a control input port for reducing said first voltage to a value less than said nominal value upon application thereto of a control signal; and a sensor coupled to said first and second voltage sources, for generating said control signal during those times in which the voltage of said second voltage source is less than one of said actual first voltage and said nominal first voltage, and for coupling said control signal to said first voltage source.

9. A circuit arrangement according to claim 8, wherein said sensor comprises a comparator coupled to said second voltage source, for comparing the actual value of said second voltage with the actual value of said first voltage, and for generating said control signal when said actual value of said second voltage is less than the actual value of said first voltage.

10. A circuit arrangement according to claim 8, wherein said first voltage source reduces said first voltage to essentially zero volts upon application thereto of said control signal.

11. A circuit arrangement according to claim 8, wherein said sensor comprises a comparator coupled to said second voltage source, for comparing the actual value of said second voltage with a reference voltage substantially equal to said nominal value of said first voltage, and for generating said control signal when said actual value of said second voltage is less than said reference voltage.

12. A circuit arrangement according to claim 11, wherein said comparator comprises a transistor including a controlled current path and a control current path, which control current path exhibits an offset voltage when control current flows therethrough to cause controlled current flow in said controlled current path;

voltage division means coupled to said second voltage source and to said control current path, for applying a portion of said second voltage to said control current path, for causing said control current to flow in said control current path when said portion of said second voltage is substantially equal to said offset voltage.

13. A circuit arrangement according to claim 11, wherein said comparator comprises:

a first transistor including a control electrode defining a forward voltage, and also including a controlled current path defining first and second electrodes, which controlled current path is coupled to a reference source and, by way of a resistor, to a source of potential;

voltage division means defining input terminals coupled to said reference source and to receive said second voltage, and also defining a tap coupled to said control electrode, for dividing said second voltage to a divided value appearing at said control electrode of said first transistor, for rendering said first transistor conductive when said divided value exceeds said nominal control electrode forward voltage; and coupling means coupled to said control input port of said first voltage source, for coupling said control signal from said controlled current path of said first transistor to said first voltage source.

14. A circuit arrangement according to claim 11, wherein said control electrode of said first transistor is a base electrode, said controlled current path of said transistor is an emitter-to-collector path, said emitter is connected to reference ground, and said forward voltage is a base-emitter voltage; and said voltage division means comprises a resistive voltage divider connected between said second source of voltage and said reference ground.

15. A circuit arrangement according to claim 14, wherein said coupling means comprises a bipolar transistor having its collector-to-emitter path coupled to said control input port of said first voltage source and to said reference ground, and its base electrode coupled to said collector of said first transistor, for maintaining said control input port at a voltage near said reference ground when the actual value of said second source of voltage is smaller in magnitude than said nominal value of said first source of voltage.

16. A protection arrangement for a microcircuit requiring for its operation plural power sources having relatively higher and lower nominal voltages, where a lower-voltage power input electrode of said microcircuit is internally connected by way of unidirectional current conducting means to a higher-voltage power input electrode, said protection arrangement comprising:

a shutdown electrode coupled to said power source having relatively lower nominal voltage, for disabling said power source having relatively lower nominal voltage in response to one of a relatively high and a relatively low control voltage applied thereto;

sensing means coupled to said power source having a relatively higher nominal voltage and to said shutdown electrode, for producing said one of said relatively high and said relatively low control voltages in response to an actual value of said relatively higher nominal voltage which is lower than said relatively lower nominal voltage, for thereby disabling said power source having relatively lower nominal voltage when the actual voltage of said power source having relatively high nominal voltage is less than said lower nominal voltage.

* * * * *